United States Patent
Fukumoto et al.

(10) Patent No.: US 9,728,552 B1
(45) Date of Patent: Aug. 8, 2017

(54) SEMICONDUCTOR MEMORY DEVICE HAVING VOIDS BETWEEN WORD LINES AND A SOURCE LINE

(71) Applicant: Kabushiki Kaisha Toshiba, Minato-ku (JP)

(72) Inventors: Atsushi Fukumoto, Mie (JP); Fumiki Aiso, Kuwana (JP); Hajime Nagano, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/205,481

(22) Filed: Jul. 8, 2016

Related U.S. Application Data

(60) Provisional application No. 62/292,913, filed on Feb. 9, 2016.

(51) Int. Cl.
| | |
|---|---|
| *H01L 27/115* | (2017.01) |
| *H01L 29/792* | (2006.01) |
| *H01L 29/423* | (2006.01) |
| *H01L 21/28* | (2006.01) |
| *H01L 29/51* | (2006.01) |
| *H01L 29/788* | (2006.01) |
| *H01L 23/522* | (2006.01) |

(Continued)

(52) U.S. Cl.
CPC .... *H01L 27/11582* (2013.01); *H01L 27/1052* (2013.01); *H01L 27/11565* (2013.01); *H01L 27/11568* (2013.01)

(58) Field of Classification Search
CPC .......... H01L 27/11582; H01L 27/1052; H01L 27/11568; H01L 27/11565
See application file for complete search history.

(56) References Cited

U.S. PATENT DOCUMENTS

| | | | |
|---|---|---|---|
| 8,089,120 B2 | 1/2012 | Tanaka et al. | |
| 8,455,940 B2 * | 6/2013 | Lee .................. | H01L 27/11565 257/288 |

(Continued)

FOREIGN PATENT DOCUMENTS

| | | |
|---|---|---|
| JP | 2007-266143 A | 10/2007 |
| JP | 2010-114113 | 5/2010 |
| JP | 2012-94869 | 5/2012 |

*Primary Examiner* — Marcos D Pizarro Crespo
*Assistant Examiner* — Nelson Garces
(74) *Attorney, Agent, or Firm* — Oblon, McClelland, Maier & Neustadt, L.L.P.

(57) ABSTRACT

According to an embodiment, a semiconductor memory device includes first and second stacked bodies, first and second memory parts, and an insulating part. The first stacked body includes first conductive layers and first insulating layers alternately arranged in a first direction. The second stacked body includes second conductive layers and second insulating layers alternately arranged in the first direction. The first and second memory parts extend through the first and second stacked body in the first direction, respectively. The insulating part is provided between the first and second stacked bodies. The insulating part includes a first oxygen-containing film including silicon and oxygen, and a nitrogen-containing film including silicon and nitrogen. The first oxygen-containing film is provided between at least one of first conductive layers and the nitrogen-containing film. The first oxygen-containing film has a hole.

16 Claims, 6 Drawing Sheets

(51) Int. Cl.
*H01L 27/11582* (2017.01)
*H01L 27/11565* (2017.01)
*H01L 27/11568* (2017.01)
*H01L 27/105* (2006.01)

(56) References Cited

U.S. PATENT DOCUMENTS

| | | | |
|---|---|---|---|
| 8,513,729 B2* | 8/2013 | Choe | G11C 16/0483 |
| | | | 257/324 |
| 8,836,011 B2* | 9/2014 | Uenaka | H01L 29/66833 |
| | | | 257/324 |
| 8,836,013 B2 | 9/2014 | Lee | |
| 8,912,591 B2* | 12/2014 | Baek | H01L 27/11568 |
| | | | 257/324 |
| 8,921,918 B2 | 12/2014 | Shim et al. | |
| 8,933,501 B2* | 1/2015 | Makala | H01L 21/28273 |
| | | | 257/316 |
| 9,490,140 B2* | 11/2016 | Go | H01L 29/495 |
| 2007/0252201 A1 | 11/2007 | Kito et al. | |
| 2011/0284947 A1 | 11/2011 | Kito et al. | |
| 2011/0287597 A1 | 11/2011 | Kito et al. | |
| 2012/0068255 A1* | 3/2012 | Lee | H01L 27/11582 |
| | | | 257/324 |
| 2015/0372006 A1 | 12/2015 | Kito et al. | |
| 2016/0240550 A1* | 8/2016 | Jung | H01L 27/11568 |
| 2017/0025428 A1* | 1/2017 | Lai | H01L 27/11556 |
| 2017/0062468 A1* | 3/2017 | Son | H01L 27/11582 |

\* cited by examiner

SEMICONDUCTOR MEMORY DEVICE HAVING VOIDS BETWEEN WORD LINES AND A SOURCE LINE

CROSS-REFERENCE TO RELATED APPLICATIONS

This application is based upon and claims the benefit of priority from U.S. Provisional Patent Application 62/292,913, filed on Feb. 9, 2016; the entire contents of which are incorporated herein by reference.

FIELD

Embodiments described later relate to a semiconductor memory device and a method for manufacturing the same.

BACKGROUND

In the semiconductor memory device, there is desired an improvement in memory density.

DETAILED DESCRIPTION

Figure 1:
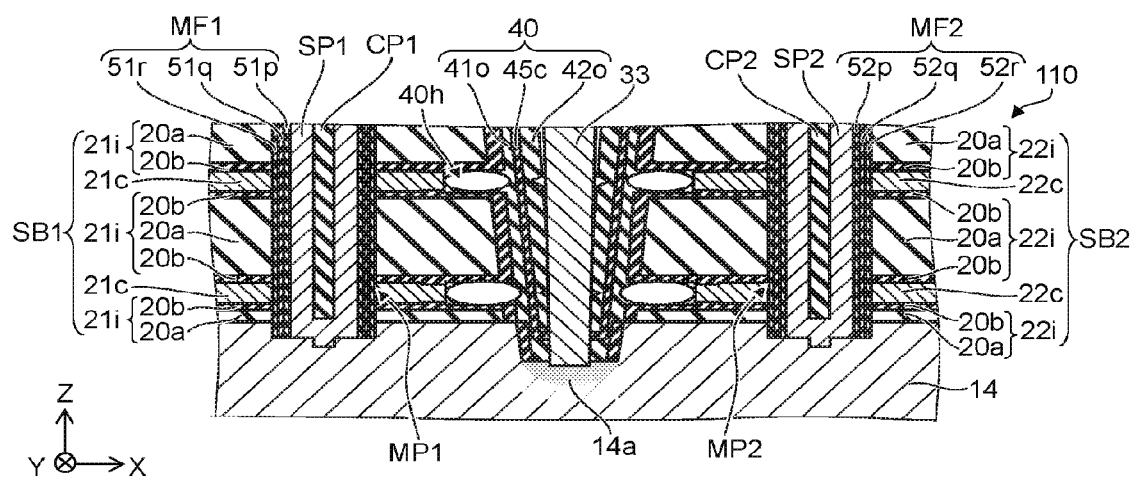
FIG. 1 is a schematic cross-sectional view illustrating a semiconductor memory device according to a first embodiment.

According to an embodiment, a semiconductor memory device includes a first stacked body, a second stacked body, a first memory part, a second memory part, and an insulating part. The first stacked body includes a plurality of first conductive layers and a plurality of first insulating layers alternately arranged in a first direction. The second stacked body includes a plurality of second conductive layers and a plurality of second insulating layers alternately arranged in the first direction. The first memory part extends through the first stacked body in the first direction. The second memory part extends through the second stacked body in the first direction. The insulating part is provided between the first stacked body and the second stacked body. The insulating part includes a first oxygen-containing film including silicon and oxygen, and a nitrogen-containing film including silicon and nitrogen. The first oxygen-containing film is provided between at least one of the plurality of first conductive layers and the nitrogen-containing film. The first oxygen-containing film has a hole.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a semiconductor memory device according to a first embodiment.

As shown in FIG. 1, the semiconductor memory device 110 according to the embodiment includes a first stacked body SB1, a second stacked body SB2, a first memory part MP1, a second memory part MP2, and an insulating part 40.

The first stacked body SB1 includes a plurality of first conductive layers 21c and a plurality of first insulating layers 21i alternately arranged in a first direction.

The first direction is defined as a Z-axis direction. One of directions perpendicular to the Z-axis direction is defined as an X-axis direction. One of the directions perpendicular to the Z-axis direction and the X-axis direction is defined as a Y-axis direction.

The second stacked body SB2 includes a plurality of second conductive layers 22c and a plurality of second insulating layers 22i alternately arranged in the first direction (the Z-axis direction).

The first stacked body SB1 and the second stacked body SB2 extend in, for example, the Y-axis direction. The second stacked body SB2 is arranged side by side with the first stacked body SB1 in the X-axis direction.

The plurality of first conductive layers 21c and the plurality of second conductive layers 22c include, for example, metal (e.g., tungsten). The thickness (the length in the Z-axis direction) of one of the plurality of first conductive layers 21c is, for example, 10 nanometers or more and 40 nanometers or less. The plurality of first insulating layers 21i and the plurality of second insulating layers 22i include at least one of, for example, a silicon oxide and a silicon nitride. The thickness (the length in the Z-axis direction) of each of the plurality of first insulating layers 21i is, for example, 10 nanometers or more and 40 nanometers or less. In the embodiment, the thickness described above is illustrative only, and the embodiment is not limited to the thickness described above.

The first memory part MP1 extends in the first direction through the first stacked body SB1. The second memory part MP2 extends in the first direction through the second stacked body SB2. The first memory part MP1 and the second memory part MP2 each have, for example, a pillar shape extending in the first direction.

The insulating part 40 is provided between the first stacked body SB1 and the second stacked body SB2. The insulating part 40 includes silicon and nitrogen.

It has been found out that in a reference example in which the insulating part 40 includes silicon and oxygen, when forming and then annealing (heating) the conductive layers (the first conductive layers 21c and the second conductive layers 22c), holes (voids) occur in the insulating part 40. It has been found out that if the holes occur, short circuit occurs between, for example, the conductive layers and other conductive members in some case.

It has been found out that the phenomenon is apt to occur in the case in which, for example, a gas including a metal fluoride is used when forming the conductive layers. As described later, there is a method (replacement method) of alternately stacking insulating layers and sacrifice layers, removing the sacrifice layers through predetermined holes (e.g., slits), and then filling the space obtained by the removal with a material to be the conductive layers when forming the stacked body. The material to be the conductive layers, for example, a gas including a metal fluoride (e.g., tungsten fluoride ($WF_6$)) is used in some cases. Fluorine included in the gas remains, and has contact with the insulating part 40 in some cases. For example, in the reference example in which the insulating part includes a silicon oxide, a hydrogen fluoride (e.g., hydrofluoric acid) is apt to be generated due to the remaining fluorine. It is conceivable that, for example, hydroxyl radicals exist in the silicon oxide, and the hydrogen fluoride is produced from hydrogen in the hydroxyl radical and the residual fluorine. It is conceivable that the hydrogen fluoride etches the silicon oxide, and as a result, the holes are produced.

In contrast, in the embodiment, the insulating part 40 includes silicon and nitrogen. Thus, generation of the hydrogen fluoride is inhibited. Thus, etching of the insulating part 40 is inhibited. As a result, generation of the holes (voids) can be inhibited.

In the embodiment, since the insulating part 40 includes silicon and nitrogen, the breakdown voltage in the insulating part 40, for example, can be raised. For example, the width (e.g., the width along the X-axis direction) of the insulating part 40 can be decreased. For example, the intervals between the stacked bodies can be decreased. Thus, the memory density, for example, can be improved.

Further, since the breakdown voltage of the insulating part 40 can be improved, the reliability of the semiconductor memory device, for example, can be improved. For example, the fabrication yield can be improved.

As shown in FIG. 1, in the example, the first memory part MP1 includes a first semiconductor pillar SP1 and a first memory film MF1. The first semiconductor pillar SP1 extends in the first direction (Z-axis direction) through the first stacked body SB1. The first memory film MF1 is provided between each of the first conductive layers 21c and the first semiconductor pillar SP1. The second memory part MP2 includes a second semiconductor pillar SP2 and a second memory film MF2. The second semiconductor pillar SP2 extends in the first direction through the second stacked body SB2. The second memory film MF2 is provided between each of the second conductive layers 22c and the second semiconductor pillar SP2.

In the example, the semiconductor pillars described above each have a tubular shape. The first semiconductor pillar SP1 having the tubular shape is provided around a first core pillar CP1 (e.g., an insulating film). The second semiconductor pillar SP2 having the tubular shape is provided around a second core pillar CP2 (e.g., an insulating film).

The first memory film MF1 includes a first inner film 51p, a first intermediate film 51q, and a first outer film 51r. The second memory film MF2 includes a second inner film 52p, a second intermediate film 52q, and a second outer film 52r. The inner film is provided around the semiconductor pillar, the intermediate film is provided around the inner film, and the outer film is provided around the intermediate film. The plurality of conductive layers (the first conductive layers 21c and the second conductive layers 22c) is provided around the outer film. The inner films are each, for example, a tunnel insulating film. As the inner films, there is used a silicon oxide or the like. The intermediate films are each, for example, a charge storage film. As the intermediate films, there is used, for example, a silicon nitride or the like. The outer films are each, for example, a block insulating film. As the outer films, there is used, for example, a silicon oxide or the like.

As shown in FIG. 1, in the example, there are provided a third conductive layer 33 and a fourth conductive layer 14. A part of the insulating part 40 is disposed between the first stacked body SB1 and the third conductive layer 33. Another part of the insulating part 40 is disposed between the second stacked body SB2 and the third conductive layer 33. The fourth conductive layer 14 is electrically connected to the first semiconductor pillar SP1, the second semiconductor pillar SP2, and the third conductive layer 33. For example, the fourth conductive layer 14 includes a semiconductor. The fourth conductive layer 14 is provided with a high-impurity-concentration region 14a. The fourth conductive layer 14 and the third conductive layer 33 are electrically connected via the high-impurity-concentration region 14a. The third conductive layer 33 forms, for example, a source line.

In the example, the insulating part 40 has a stacked structure. The insulating part 40 includes a first oxygen-containing film 41o, a nitrogen-containing film 45c, and a second oxygen-containing film 42o. The first oxygen-containing film 41o includes silicon and oxygen. The nitrogen-containing film 45c includes silicon and nitrogen. The second oxygen-containing film 42o includes silicon and oxygen. The first oxygen-containing film 41o and the second oxygen-containing film 42o are each, for example, a silicon oxide film. The nitrogen-containing film 45c is, for example, a silicon-nitrogen film. The first oxygen-containing film 41o is provided between at least one of the plurality of first conductive layers 21c and the nitrogen-containing film 45c. The first oxygen-containing film 41o is provided between at least one of the plurality of second conductive layers 22c and the nitrogen-containing film 45c. The nitrogen-containing film 45c is provided between the first oxygen-containing film 41o and the second oxygen-containing film 42o.

For example, the first oxygen-containing film 41o is provided between the third conductive layer 33 and the plurality of first conductive layers 21c. The first oxygen-containing film 41o is provided between the third conductive layer 33 and the plurality of second conductive layers 22c. The nitrogen-containing film 45c is provided between the first oxygen-containing film 41o and the third conductive layer 33. For example, the second oxygen-containing film 42o is provided between the nitrogen-containing film 45c and the third conductive layer 33.

As shown in FIG. 1, the first oxygen-containing film 41o may also include a hole 40h (a void). On the other hand, for example, the nitrogen-containing film 45c suppresses migration of the hydrogen fluoride from the first oxygen-containing film 41o toward the second oxygen-containing film 42o. Thus, the hole 40h is not produced in the second oxygen-containing film 42o. Alternatively, the hole 40h in the second oxygen-containing film 42o is smaller than the hole 40h in the first oxygen-containing film 41o. Alternatively, the density of the hole 40h in the second oxygen-containing film 42o is lower than the density of the hole 40h in the first oxygen-containing film 41o. The hole 40h (the void) formed in the first oxygen-containing film 41o does not substantially reach the second oxygen-containing film 42o. The nitrogen-containing film 45c suppresses the hole 40h from reaching the second oxygen-containing film 42o.

Since the first oxygen-containing film 41o includes the hole 40h (the void), an average dielectric constant in the insulating part 40, for example, can be lowered. Thus, for example, the electric capacitance formed by the conductive material provided around the insulating part 40 can be decreased. For example, the power consumption can be reduced.

In the embodiment, for example, the second oxygen-containing film 42o is suppressed from having contact with the conductive layers (the first conductive layers 21c and the second conductive layers 22c). The second oxygen-containing film 42o is separated from the conductive layers (the first conductive layers 21c and the second conductive layers 22c).

The third conductive layer 33 is suppressed from having contact with the first conductive layers 21c and the second conductive layers 22c. The third conductive layer 33 is separated from the first conductive layers 21c and the second conductive layers 22c.

For example, the concentration of the hydroxyl radical in the nitrogen-containing film 45c is lower than the concentration of the hydroxyl radical in the first oxygen-containing film 41o.

The concentration of the hydroxyl radical in the first oxygen-containing film 41O is higher than the concentration of the hydroxyl radical in the second oxygen-containing film 42o.

In the example, the first conductive layers 21c and the second conductive layers 22c recede from side surfaces of the first insulating layers 21i and the second insulating layers 22i, respectively. Thus, at least a part (e.g., at least a part of the first oxygen-containing film 41o) of the insulating part 40 is provided between the plurality of first insulating layers 21i. At least a part (e.g., at least a part of the first oxygen-containing film 41o) of the insulating part 40 is provided between the plurality of second insulating layers 22i.

In the example, the first insulating layers 21i and the second insulating layers 22i each have a stacked structure. For example, these insulating layers each include a first insulating film 20a (e.g., a silicon oxide film) and a second insulating film 20b (e.g., a silicon nitride film). A part of the second insulating film 20b is stacked on the first insulating film 20a in the Z-axis direction. A part of the second insulating film 20b is provided between the first insulating film 20a and the insulating part 40.

Hereinafter, an example of a method for manufacturing the semiconductor memory device 110 will be described.

FIG. 2A through FIG. 2C and FIG. 3A through FIG. 3C are schematic cross-sectional views along a process sequence illustrating the method for manufacturing the semiconductor memory device according to the first embodiment.

Figure 2A:
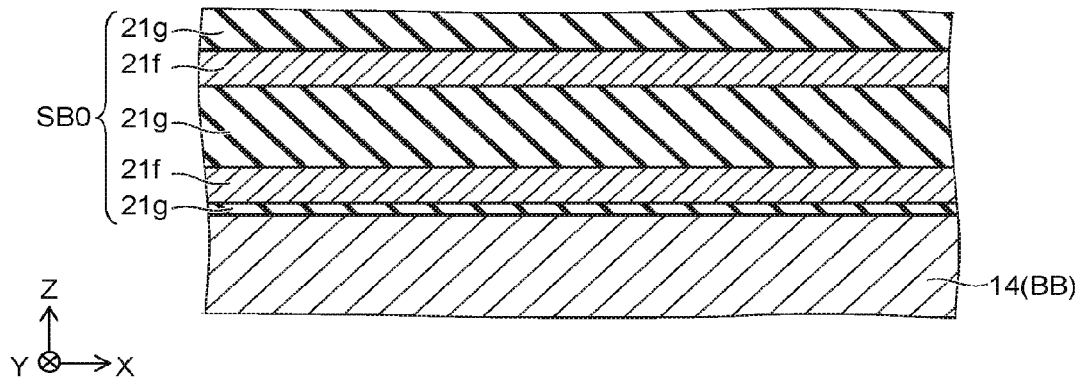
FIG. 2A through FIG. 2C and FIG. 3A through FIG. 3C are schematic cross-sectional views along a process sequence illustrating the method for manufacturing the semiconductor memory device according to the first embodiment.

As shown in FIG. 2A, a plurality of first films 21f and a plurality of second films 21g are alternately formed on a first surface 10a of a substrate BB. The substrate BB is, for example, a semiconductor substrate (e.g., a silicon substrate). On the substrate BB, there is provided the fourth conductive layer 14 (e.g., a semiconductor layer) described above. In the example, the first surface 10a is an upper surface of the fourth conductive layer 14. The substrate BB may also have an SIO structure.

The first films 21f are each, for example, a silicon nitride film. The second films 21g are each, for example, a silicon oxide film. The first films 21f are each, for example, a sacrifice layer. The plurality of first films 21f and the plurality of second films 21g constitute a stacked body SB0.

Figure 2B:
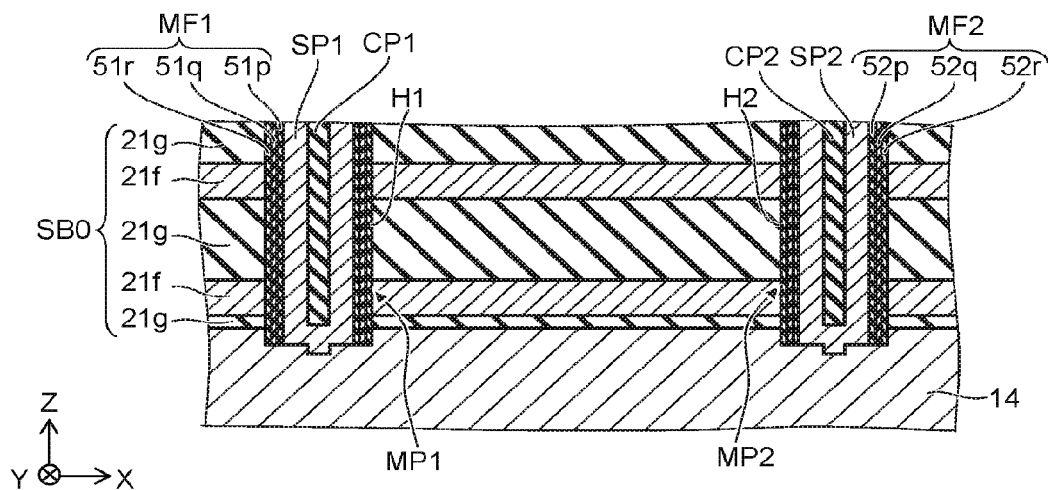

As shown in FIG. 2B, a first hole H1 and a second hole H2 are formed in the stacked body SB0 including the plurality of first films 21f and the plurality of second films 21g. These holes extend in the first direction (the Z-axis direction) crossing the first surface 10a. Further, the memory parts (the first memory part MP1 and the second memory part MP2) are formed in the first hole H1 and the second hole H2, respectively. The first memory part MP1 includes the first core pillar CP1, the first semiconductor pillar SP1, and the first memory film MF1. The second memory part MP2 includes the second core pillar CP2, the second semiconductor pillar SP2, and the second memory film MF2. The first semiconductor pillar SP1 and the second semiconductor pillar SP2 are electrically connected to the fourth conductive layer 14.

Figure 2C:
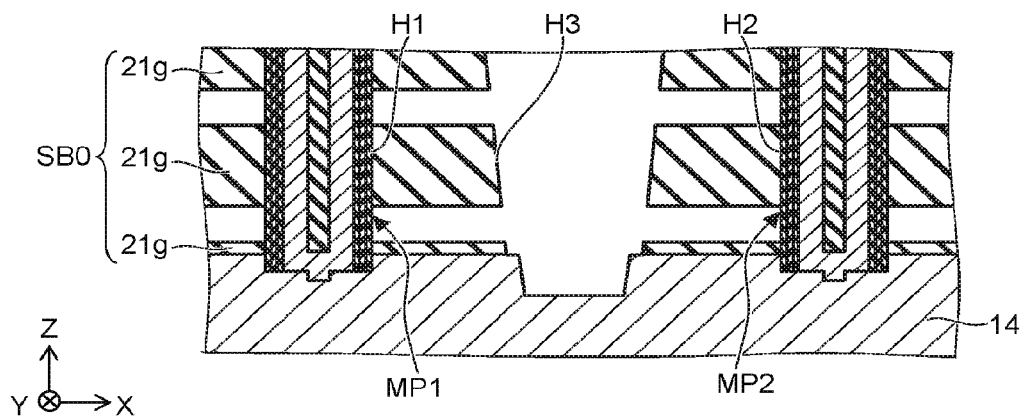

As shown in FIG. 2C, between the first hole H1 and the second hole H2, there is formed a third hole H3 in the stacked body SB0. The third hole H3 extends in the first direction. The third hole H3 has, for example, a slit shape extending in the Z-axis direction and the Y-axis direction. The plurality of first films 21f are removed via the third hole H3.

Figure 3A:
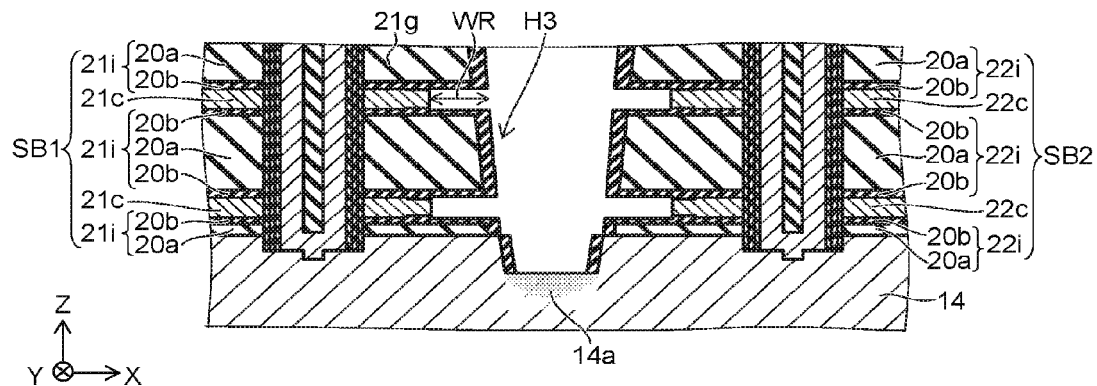

As shown in FIG. 3A, on a surface of each of the second films 21g (the silicon oxide films), there is formed a thin silicon nitride film (the second insulating film 20b described with respect to FIG. 1). The second films 21g correspond respectively to the first insulating films 20a described with respect to FIG. 1. Thus, the first insulating layers 21i and the second insulating layers 22i are formed.

An impurity is injected in the fourth conductive layer 14 exposed on the bottom part of the third hole H3. The high-impurity-concentration region 14a is formed.

Subsequently, a material (a gas) including a metal element is introduced in the space formed by the removal of the first films 21f to form a plurality of conductive layers (the plurality of first conductive layers 21c and the plurality of second conductive layers 22c). The plurality of conductive layers and the plurality of second films 21g (and the second insulating films 20b) are alternately arranged in the first direction (the Z-axis direction). The plurality of conductive layers each include the metal element described above.

The material (the gas) including the metal element is a metal fluoride. The material is, for example, a tungsten fluoride.

It is also possible to make the conductive layers (the first conductive layers 21c and the second conductive layers 22c) recede as necessary.

Figure 3B:
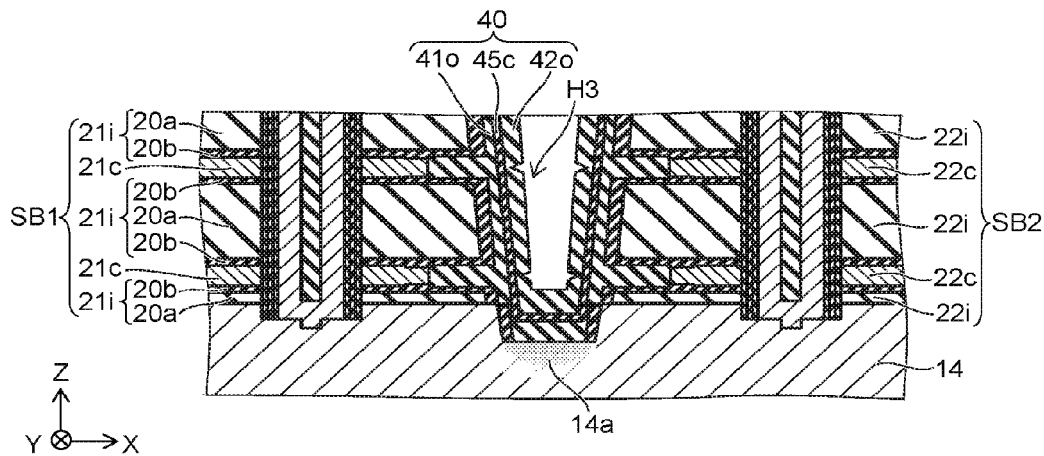

As shown in FIG. 3B, the insulating part 40 including silicon and nitride is formed in the remaining space of the third hole H3. For example, the first oxygen-containing film 41o, the nitrogen-containing film 45c, and the second oxygen-containing film 42o are formed. That is, the formation of the insulating part 40 includes the formation of the first oxygen-containing film 41O including silicon and oxygen in the remaining space of the third hole H3, and the formation of the nitrogen-containing film 45c including silicon and nitrogen in the remaining space after the formation of the first oxygen-containing film 41O. Further, the formation of the insulating part 40 may also include the formation of the second oxygen-containing film 42o including silicon and oxygen in the remaining space after the formation of the nitrogen-containing film 45c.

Subsequently, an annealing process (a heating process) is performed. The process is performed in, for example, a nitrogen atmosphere, at the temperature of appropriately 1000° C. through 1100° C., and for, for example, appropriately 1 second through 30 second. Thus, for example, the warp of the wafer (e.g., the substrate BB) is relaxed.

Figure 3C:
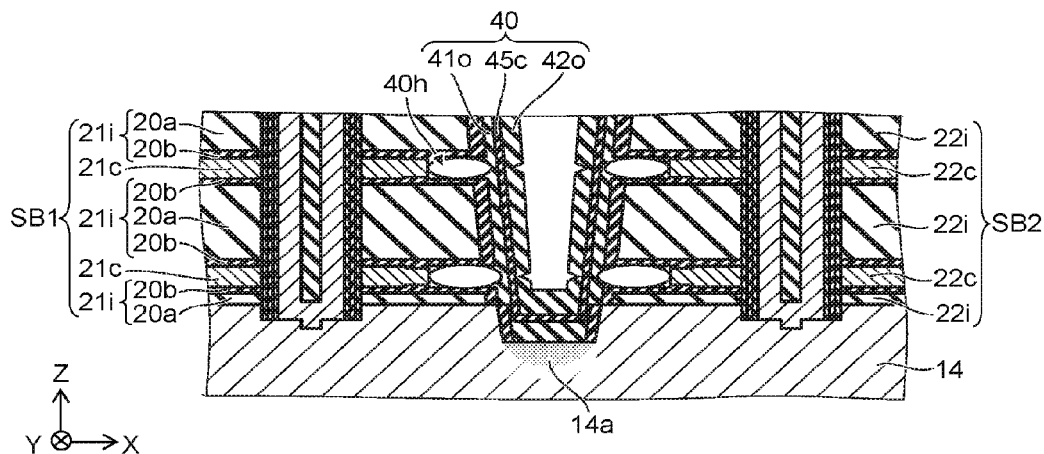

As shown in FIG. 3C, due to the process, the hole 40h is produced in the first oxygen-containing film 41O in some cases. On this occasion, in the embodiment, the nitrogen-containing film 45c is provided in the insulating part 40. Thus, the hole 40h remains in the first oxygen-containing film 41o. The hole 40h is suppressed from reaching the surface of the insulating part 40. By providing the nitrogen-containing film 45c, the breakdown voltage of the insulating part 40 is improved.

Subsequently, the conductive film (e.g., metal or a semiconductor) to be the third conductive layer 33 is formed in the remaining space of the third hole H3. Thus, the semiconductor memory device 110 is formed.

In the formation of the insulating part 40 described above, the concentration of oxygen in the first oxygen-containing film 41o may be lower than the concentration of oxygen in the second oxygen-containing film 42o. For example, the second oxygen-containing film 42o is a high-grade silicon oxide film. The first oxygen-containing film 41o is a low-oxidation silicon oxide film. Since the concentration of oxygen in the first oxygen-containing film 41o is low, oxidation of the metal (e.g., tungsten) in the conductive layers (the first conductive layers 21c and the second conductive layers 22c) can be suppressed. Thus, a low resistance can be obtained in the conductive layers.

As described above, in the manufacturing method described above, it is also possible to introduce an impurity in the surface of the substrate BB (e.g., the fourth conductive layer 14) exposed on the bottom surface of the third hole H3 between the removal (see FIG. 2C) of the plurality of first films 21f and the formation (see FIG. 3A) of the plurality of conductive layers. In the remaining space of the third hole H3 after forming the insulating part 40, it is also possible to form the conductive layer (the third conductive layer 33) on the surface of the substrate BB exposed on the bottom surface.

Figure 4A:
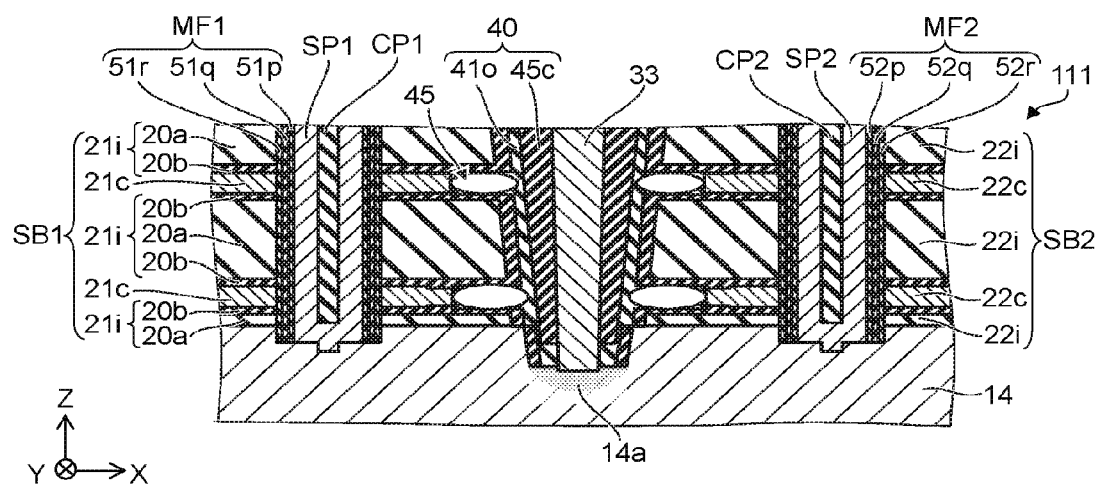
FIG. 4A and FIG. 4B are schematic cross-sectional views each illustrating another semiconductor memory device according to the first embodiment.
Figure 4B:
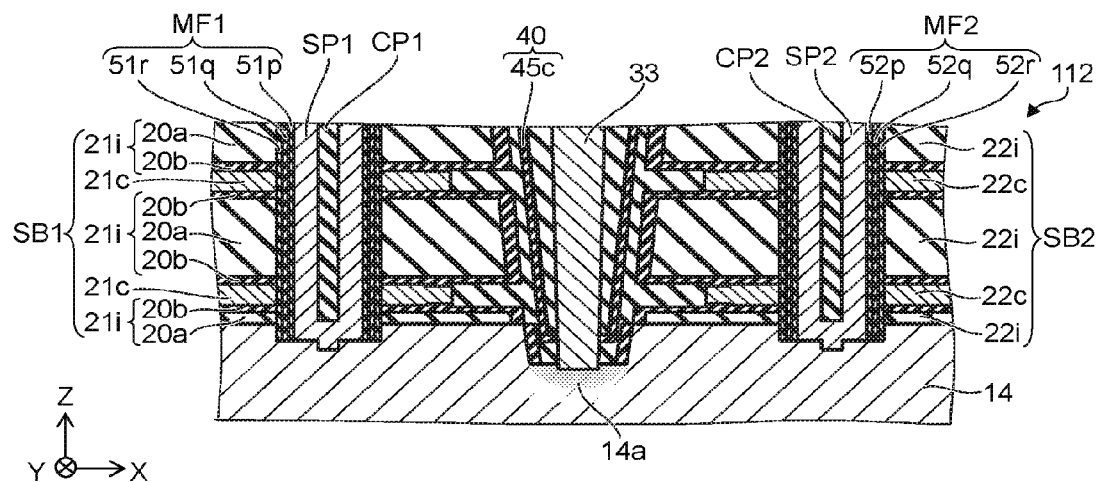

FIG. 4A and FIG. 4B are schematic cross-sectional views each illustrating another semiconductor memory device according to the first embodiment.

As shown in FIG. 4A, in another semiconductor memory device 111 according to the embodiment, the second oxygen-containing film 42o is omitted, and the first oxygen-containing film 41o and the nitrogen-containing film 45c are provided in the insulating part 40. As shown in FIG. 4B, in another semiconductor memory device 112 according to the embodiment, the first oxygen-containing film 41o and the second oxygen-containing film 42o are omitted, and the nitrogen-containing film 45c is provided in the insulating part 40.

Also in the semiconductor memory devices 111 and 112, even if, for example, the residual fluorine exists, the problem due to the hole 40h caused by the residual fluorine is suppressed from occurring. For example, a sheet resistance between the third conductive layer 33 and the first conductive layers 21c and between the conductive layer 33 and the second conductive layers 22c can be suppressed. It becomes easy to decrease the width of the insulating part 40. For example, the memory density can be improved.

Figure 5:
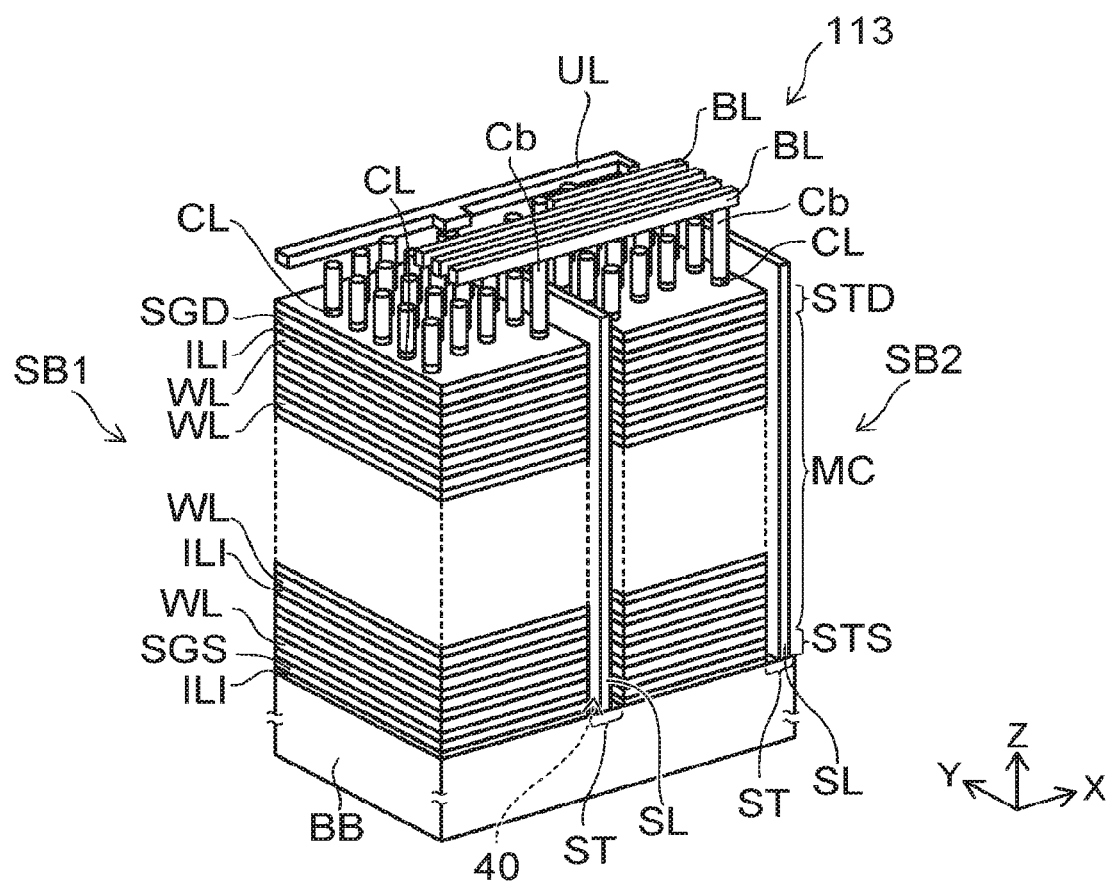
FIG. 5 is a schematic perspective view illustrating the semiconductor memory device according to the first embodiment.

FIG. 5 is a schematic perspective view illustrating the semiconductor memory device according to the first embodiment.

FIG. 5 illustrates a semiconductor memory device 113.

The semiconductor memory device 113 corresponds to one of the semiconductor memory devices 110 through 112 described above. In FIG. 5, in order to make the drawing eye-friendly, a part of the insulating part is omitted.

As shown in FIG. 5, in the semiconductor memory device 113, the substrate BB is provided. On the substrate BB, there are provided the first stacked body SB1, the second stacked body SB2, a plurality of pillar parts CL, and a plurality of slits ST. These stacked bodies are provided on the substrate BB. These stacked bodies each include a plurality of conductive layers (a source-side selection gate SGS, word lines WL, and a drain-side selection gate SGD) stacked on one another via interlayer insulating films ILI. A part of the interlayer insulating film ILI corresponds to the first insulating layers 21i and the second insulating layers 22i illustrated in FIG. 1. The word line WL corresponds to the first conductive layers 21c and the second conductive layers 22c. The number of the word lines WL is arbitrary.

A direction from the first stacked body SB1 toward the second stacked body SB2 is defined as a second direction (e.g., the X-axis direction). The second stacked body SB2 is separated from the first stacked body SB1 in the second direction. The first stacked body SB1 and the second stacked body SB2 extend along a third direction (e.g., the Y-axis direction). The third direction crosses the first direction and the second direction.

One interlayer insulating film ILI is provided on the first surface 10a of the substrate BB, and the source-side selection gate SGS is provided on the one interlayer insulating film ILI. Another interlayer insulating film ILI is provided on the source-side selection gate SGS, and the word lines WL are provided on that interlayer insulating film ILI. The interlayer insulating film ILI is provided on the word line WL located in the uppermost layer, and the drain-side selection gate SGD is provided on that interlayer insulating film ILI.

A gate electrode of a drain-side selection transistor STD corresponds to the drain-side selection gate SGD. A gate electrode of a source-side selection transistor STS corresponds to the source-side selection gate SGS. Between the drain-side selection transistor STD and the source-side selection transistor STS, there is provided a plurality of memory cells MC connected in series. The gate electrode of one of the plurality of memory cells MC corresponds to one of the word lines WL.

The slit ST is provided between the first stacked body SB1 and the second stacked body SB2. In the slit ST, there is provided a source line SL. The source line SL corresponds to the third conductive layer 33 described with respect to FIG. 1.

Above the source line SL, there is provided an upper layer interconnection UL. The upper layer interconnection UL extends in the X-axis direction. The upper layer interconnection UL is electrically connected to the plurality of source lines SL arranged along the X-axis direction. The upper layer interconnection UL is electrically connected to a peripheral circuit (not shown).

In each of the first stacked body SB1 and the second stacked body SB2, the pillar parts CL are provided. The pillar parts CL each extend in the first direction (the Z-axis direction). The pillar parts CL each have, for example, a columnar shape (including an elliptic columnar shape). In each of the pillar parts CL, there are provided the drain-side selection transistor STD, the source-side selection transistor STS, and the memory cells MC.

Above the pillar parts CL, there is provided a plurality of bit lines BL. The plurality of bit lines BL each extend in the X-axis direction. An upper end section of one of the pillar parts CL is electrically connected to one of the bit lines BL via a contact part Cb. A lower end part of the pillar parts CL is electrically connected to the source line SL via the substrate BB (the fourth conductive layer 14).

In FIG. 5, between the source line SL and the first stacked body SB1, and between the source line SL and the second stacked body SB2, there are provided the insulating parts 40 (not shown).

The desired pillar parts CL are selected by the drain-side selection transistor STD and the source-side selection transistor STS. The desired memory cell MC is selected by the word lines WL and the bit lines BL. In the memory cell MC thus selected, a writing operation, an erasing operation, and a reading operation are performed.

Second Embodiment

Figure 6A:
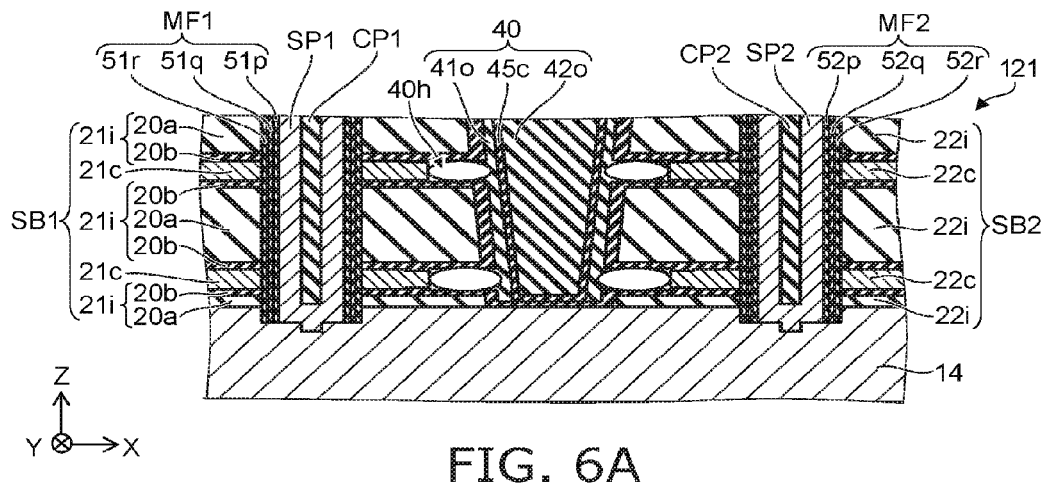
FIG. 6A through FIG. 6C are schematic cross-sectional views respectively illustrating semiconductor memory devices each according to a second embodiment.
Figure 6B:
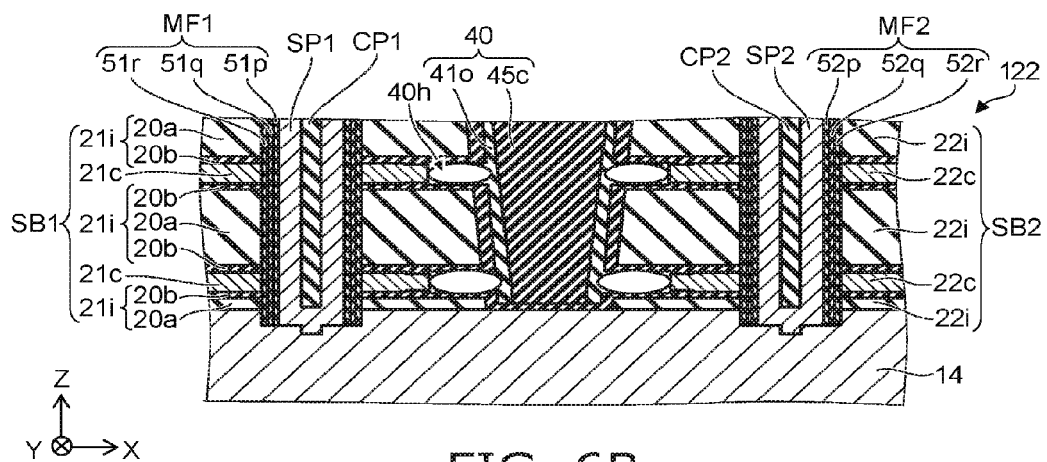
Figure 6C:
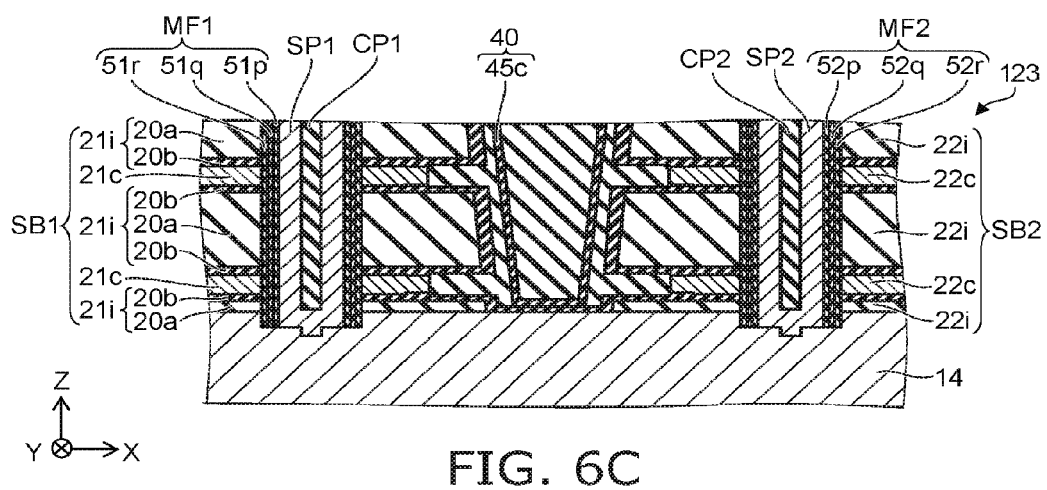

FIG. 6A through FIG. 6C are schematic cross-sectional views respectively illustrating semiconductor memory devices each according to a second embodiment.

As shown in FIG. 6A through FIG. 6C, in semiconductor memory devices 121 through 123 according to the embodiment, the third conductive layer 33 is eliminated. In this case, for example, in each of the stacked bodies, the lower end parts of the two semiconductor pillars are connected to each other. The upper end of one of the two semiconductor pillars is connected to, for example, the source line. The upper end of the other of the two semiconductor pillars is connected to, for example, the bit line. Also in the semiconductor memory devices 121 through 123, the desired writing operation, erasing operation, and reading operation are performed.

In the semiconductor memory device 121, the first oxygen-containing film 41o, the nitrogen-containing film 45c, and the second oxygen-containing film 42o are provided. In the semiconductor memory device 122, there are provided the first oxygen-containing film 41O and the nitrogen-containing film 45c. In the semiconductor memory device 123, there is provided the nitrogen-containing film 45c.

In the semiconductor memory devices 121 through 123, the insulating part 40 includes silicon and nitrogen. Thus, the hole 40h (the void) is difficult to occur. For example, even in the case in which the hole 40h (void) is provided to the first oxygen containing film 41o, the nitrogen-containing film 45c can inhibit the hole 40h from spreading to a central part of the insulating part 40.

According to the embodiment, there can be provided a semiconductor memory device capable of improving the memory density, and a method of manufacturing the semiconductor memory device.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor memory devices such as conductive layers, insulating layers, memory parts, semiconductor pillars, memory cells, and transistors, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor memory devices and methods for manufacturing the same practicable by an appropriate design modification by one skilled in the art based on the semiconductor memory devices and the methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a first stacked body including a plurality of first conductive layers and a plurality of first insulating layers alternately arranged in a first direction;
   a second stacked body including a plurality of second conductive layers and a plurality of second insulating layers alternately arranged in the first direction;
   a first memory part extending through the first stacked body in the first direction;
   a second memory part extending through the second stacked body in the first direction; and
   an insulating part provided between the first stacked body and the second stacked body,
   the insulating part including
      a first oxygen-containing film including silicon and oxygen, and
      a nitrogen-containing film including silicon and nitrogen,
   the first oxygen-containing film being provided between at least one of the plurality of first conductive layers and the nitrogen-containing film, and
   the first oxygen-containing film having a hole.

2. The device according to claim 1, wherein
   the insulating part further includes a second oxygen-containing film including silicon and oxygen, and
   the nitrogen-containing film is provided between the first oxygen-containing film and the second oxygen-containing film.

3. The device according to claim 2, wherein
   the hole does not reach the second oxygen-containing film.

4. The device according to claim 1, wherein
   the first memory part includes
      a first semiconductor pillar extending through the first stacked body in the first direction, and
      a first memory film provided between each of the plurality of first conductive layers and the first semiconductor pillar, and
   the second memory part includes
      a second semiconductor pillar extending through the second stacked body in the first direction, and a second memory film provided between each of the plurality of second conductive layers and the second semiconductor pillar.

5. The device according to claim 4, further comprising:
a third conductive layer; and
a fourth conductive layer,
a part of the insulating part being disposed between the first stacked body and the third conductive layer,
another part of the insulating part being disposed between the second stacked body and the third conductive layer, and
the fourth conductive layer being electrically connected to the first semiconductor pillar, the second semiconductor pillar, and the third conductive layer.

6. The device according to claim 5, wherein
the first oxygen-containing film is provided between the third conductive layer and the plurality of first conductive layers, and
the nitrogen-containing film is provided between the first oxygen-containing film and the third conductive layer.

7. The device according to claim 6, wherein
a concentration of a hydroxyl radical in the nitrogen-containing film is lower than a concentration of the hydroxyl radical in the first oxygen-containing film.

8. The device according to claim 6, wherein
at least a part of the first oxygen-containing film is provided between the plurality of first insulating layers.

9. The device according to claim 6, wherein
the insulating part further includes a second oxygen-containing film including silicon and oxygen, and
the nitrogen-containing film is provided between the first oxygen-containing film and the second oxygen-containing film.

10. The device according to claim 9, wherein
a concentration of a hydroxyl radical in the first oxygen-containing film is higher than a concentration of the hydroxyl radical in the second oxygen-containing film.

11. The device according to claim 9, wherein
the second oxygen-containing film is separated from the plurality of first conductive layers.

12. The device according to claim 9, wherein
a concentration of oxygen in the first oxygen-containing film is lower than a concentration of oxygen in the second oxygen-containing film.

13. The device according to claim 9, wherein
the hole does not reach the second oxygen-containing film.

14. The device according to claim 5, wherein
the first stacked body extends in a third direction crossing the first direction and a second direction from the first stacked body toward the second stacked body,
the second stacked body extends in the third direction, and
the third conductive layer expands along the first direction and the third direction.

15. The device according to claim 1, wherein
the plurality of first conductive layers and the plurality of second conductive layers include tungsten.

16. The device according to claim 1, wherein
one of the plurality of first conductive layers include fluorine.

\* \* \* \* \*